(12) United States Patent
Cheng et al.

(10) Patent No.: US 8,444,868 B2
(45) Date of Patent: May 21, 2013

(54) METHOD FOR REMOVING COPPER OXIDE LAYER

(75) Inventors: Tien-Jen Cheng, Hopewell Junction, NY (US); Stephan Grunow, Hopewell Junction, NY (US); Zhengwen Li, Hopewell Junction, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 582 days.

(21) Appl. No.: 12/695,273

(22) Filed: Jan. 28, 2010

(65) Prior Publication Data

US 2011/0183520 A1 Jul. 28, 2011

(51) Int. Cl.
*C23F 1/00* (2006.01)

(52) U.S. Cl.
USPC .......... 216/58; 216/73; 216/78; 134/1.3; 438/687; 438/706

(58) Field of Classification Search
None
See application file for complete search history.

(56) References Cited

U.S. PATENT DOCUMENTS

| 4,333,785 A | 6/1982 | Erickson |
| 4,452,643 A | 6/1984 | Martin et al. |
| 5,336,363 A | 8/1994 | Morita |
| 5,532,094 A | 7/1996 | Arimura et al. |
| 6,050,479 A * | 4/2000 | Watanabe et al. ............. 228/202 |
| 6,207,551 B1 | 3/2001 | Chungpaiboonpatana et al. |
| 6,482,740 B2 * | 11/2002 | Soininen et al. ............. 438/686 |
| 6,679,951 B2 * | 1/2004 | Soininen et al. ............. 148/240 |
| 6,805,138 B2 * | 10/2004 | Akbar et al. ................ 134/1.2 |
| 7,060,631 B2 | 6/2006 | Morgan |
| 7,153,197 B2 | 12/2006 | Shih et al. |
| 7,332,428 B2 | 2/2008 | Beck |
| 7,556,711 B2 | 7/2009 | Miyoshi |
| 2003/0136423 A1 | 7/2003 | Akbar et al. |
| 2006/0255315 A1 * | 11/2006 | Yellowaga et al. .......... 252/79.1 |

FOREIGN PATENT DOCUMENTS

| EP | 504705 A1 * | 9/1992 |
| JP | 63219588 | 9/1988 |
| JP | 6456884 | 3/1989 |
| JP | 6280066 | 10/1994 |
| JP | 8264499 | 10/1996 |
| JP | 9251972 | 9/1997 |

* cited by examiner

*Primary Examiner* — Anita Alanko
(74) *Attorney, Agent, or Firm* — Scully, Scott, Murphy & Presser, P.C.; Yuanmin Cai

(57) ABSTRACT

The invention is directed to a method for removing copper oxide from a copper surface to provide a clean copper surface, wherein the method involves exposing the copper surface containing copper oxide thereon to an anhydrous vapor containing a carboxylic acid compound therein, wherein the anhydrous vapor is generated from an anhydrous organic solution containing the carboxylic acid and one or more solvents selected from hydrocarbon and ether solvents.

19 Claims, 2 Drawing Sheets

METHOD FOR REMOVING COPPER OXIDE LAYER

BACKGROUND

The present invention generally relates to a method for removing copper oxide from a copper surface, and more particularly, to such a process incorporated in a semiconductor manufacturing process.

Copper interconnects have now been generally established in semiconductor devices. A common problem encountered in the use of copper interconnects has been the formation of a copper oxide coat during semiconductor processing, such as after the step of chemical-mechanical polishing (CMP) of the semiconductor device. The residual copper oxide on the surface is highly undesirable because it reduces and degrades the adhesion, and hence, interconnect reliability, between the copper surface and a film subsequently deposited on the copper. The film deposited on the copper interconnects is typically a protective film or etch stop layer, such as SiN, SiC, or a nitrogen-doped silicon carbide layer (e.g., NBLOK™, or "SiCN").

Because of the adverse effects of copper oxide on copper interconnects, a copper oxide removal step is generally included in semiconductor processing. In the conventional processing of semiconductors, copper oxide removal is accomplished by a plasma treatment step. However, the plasma treatment is particularly problematic in that it causes damage to the interlevel dielectric (ILD) material contained on the semiconductor device. The damage to the ILD material by plasma treatment can be particularly acute in the case of 32 nm and beyond processing technologies. Other methods of copper oxide removal include treating the oxidized copper layer with a strong acid, such as nitric acid. However, chemical treatments with a strong acid tend to cause damage, such as pitting, to the copper surface.

Accordingly, there are efforts to find a method for copper oxide removal that effectively removes the copper oxide layer while not adversely affecting the semiconductor device. It would be further desirable if such a method were readily integratable into existing semiconductor processing designs. It would also be desired for the method to be similar or lower in cost than existing copper oxide removal technologies.

SUMMARY

The invention generally involves a method for removing copper oxide from a copper surface by exposing a copper surface containing copper oxide thereon to an anhydrous vapor containing one or more carboxylic acid compounds. In a preferred embodiment, the anhydrous vapor containing the carboxylic acid is generated from an anhydrous organic solution of the carboxylic acid, wherein the solution of the carboxylic acid contains the carboxylic acid and one or more solvents selected from hydrocarbon and ether solvents.

In a particular embodiment, the method for copper oxide removal is incorporated into a method for processing a semiconductor substrate that contains copper interconnects thereon in which the copper interconnects contain a layer of copper oxide. In a preferred embodiment, the method involves: (i) removing the layer of copper oxide by exposing the copper surface containing copper oxide thereon to an anhydrous vapor containing one or more carboxylic acid compounds such that a clean copper surface absent a copper oxide layer is provided on the copper interconnects; and (ii) depositing a protective film on at least the cleaned copper interconnects, wherein the copper oxide removal process through the deposition of the protective film is conducted in the substantial absence of oxygen and water vapor.

The copper oxide removal process described herein is advantageously highly effective in removing a copper oxide film from a copper surface while not adversely affecting a semiconductor device in the manner caused by plasma processing. The method described herein is also advantageously cost effective and readily integratable into existing semiconductor processing designs.

DETAILED DESCRIPTION OF PARTICULAR EMBODIMENTS

Figure 1A:
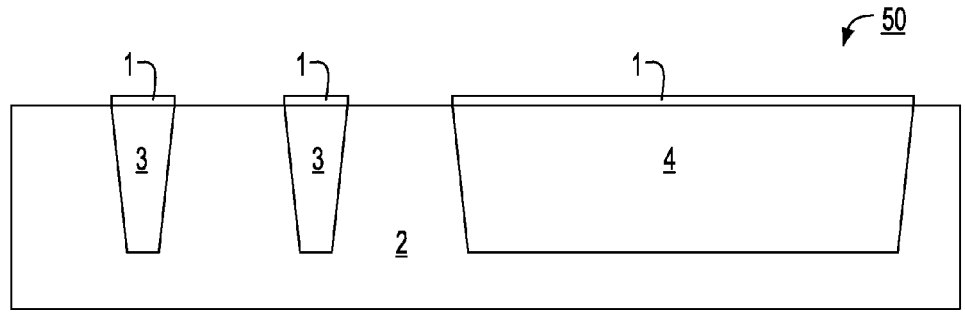
FIGS. 1A-1C are exemplary depictions of a copper oxide removal and deposition process of the invention.

In one aspect, the invention is directed to a method of removing a copper oxide film from a copper surface by exposing the copper surface containing the copper oxide film thereon to an anhydrous vapor containing one or more carboxylic acid compounds. The anhydrous vapor can be generated from any suitable anhydrous liquid source containing the one or more carboxylic acids, such as an anhydrous liquid form of the carboxylic acid (i.e., 100 wt % carboxylic acid) or an anhydrous solution of the carboxylic acid.

By being "anhydrous" is meant that the anhydrous liquid source contains substantially or absolutely no water (i.e., not even a trace). For example, it is preferred that the anhydrous liquid source contains no more than 1,000 ppm, and more preferably, no more than 500 ppm, or 100 ppm, or 10 ppm, or even 1 ppm of water. The liquid source of carboxylic acid can be ensured to be anhydrous by, for example, use of pre-dried carboxylic acid, anhydrous solvents (if used), incorporation of drying beads in the liquid source, or purging with a dry inert gas, such as nitrogen or argon.

In one embodiment, the copper surface is a pure copper surface. In another embodiment, the copper surface is a mixture of copper and one or more other metals. A copper-metal mixture can be a heterogeneous mixture, or alternatively, a homogeneous mixture, such as an alloy. Some alloys of copper include copper-tantalum, copper-manganese, copper-aluminum, copper-titanium, copper-platinum, copper-zinc, copper-nickel, and copper-silver alloys. Generally, the alloys considered herein contain copper in an amount of at least 40% by weight of the alloy, and more generally, at least 50%, 60%, 70%, 80%, 90%, 95%, 97%, 98%, or 99% by weight of the alloy. In a particular embodiment, the copper surface is part of a semiconductor device (i.e., semiconductor substrate). When the copper surface is part of a semiconductor substrate, the copper surface is typically a copper surface of one or more copper interconnects contained on the semiconductor substrate.

The carboxylic acid compound can be, for example, a monocarboxylic acid, dicarboxylic acid, or tricarboxylic acid compound. The carboxylic acid compound can be straight-chained or branched, saturated or unsaturated, cyclic or acyclic, and aliphatic or aromatic. Preferably, the carboxylic acid compound contains precisely, or at least, or no more than one, two, three, four, five, six, seven, or eight carbon atoms, or a number of carbon atoms within a range bounded by any two of the foregoing carbon atom numbers. In one embodiment, a single carboxylic acid compound is used, while in another embodiment, two or more carboxylic acid compounds are used.

In one embodiment, the group attached to the carboxylic acid (—COOH) group is a hydrogen atom, thus referring to formic acid (HCOOH). In another embodiment, the group attached to the carboxylic acid group is a hydrocarbon group containing solely carbon and hydrogen atoms. In another embodiment, the group attached to the carboxylic acid group is a hydrocarbon group having one or more of its hydrogen atoms (i.e., those engaged in a C—H bond) substituted by a halogen atom (e.g., F, Cl, or Br).

Some examples of monocarboxylic acid compounds include formic acid, acetic acid, trifluoroacetic acid, propionic acid, butyric acid, valeric acid, benzoic acid, cyclopentylcarboxylic acid, and acrylic acid. Some examples of dicarboxylic acids include oxalic acid, malonic acid, glutaric acid, phthalic acid, isophthalic acid, and terephthalic acid. Some examples of tricarboxylic acids include citric acid and isocitric acid.

The copper surface is contacted with the anhydrous vapor of the carboxylic acid compound under conditions in which complete removal of the copper oxide film is achieved. Some of the conditions that have a particular bearing on the ability of the carboxylic acid compound to completely remove the copper oxide film is the duration of contact of the carboxylic acid vapor with the copper surface (i.e., "contact time" or "process time"), the temperature of the copper surface and/or carboxylic acid vapor during contact of the copper surface with the carboxylic acid (i.e., the "process temperature"), the concentration of carboxylic acid in the vapor, and the flow rate of the carboxylic acid-containing vapor.

In different embodiments, the process time can be about, at least, or no more than, for example, 30 seconds, 1 minute, 2 minutes, 5 minutes, 10 minutes, 15 minutes, 20 minutes, or within a range bounded by any two of these values. In different embodiments, the process temperature is about, at least, or no more than 50° C., 60° C., 70° C., 80° C., 90° C., 100° C., 110° C., 125° C., 150° C., 175° C., 200° C., 225° C., 250° C., 275° C., 300° C., 325° C., 350° C., 375° C., or 400° C., or a temperature within a range bounded by any two of these values. In different embodiments, the flow rate of the vapor is suitably adjusted to, for example, 1 mL/min, 5 mL/min, 10 mL/min, or 15 mL/min, or a flow rate within a range bounded by any two of these values.

In a preferred embodiment, the vapor of anhydrous carboxylic acid is generated from an anhydrous organic solution (i.e., "solution") of the carboxylic acid, wherein the solution of carboxylic acid contains the carboxylic acid and one or more solvents selected from hydrocarbon and ether solvents. Use of such a solution of the carboxylic acid provides several advantages. One advantage is that heat-induced polymerization of the carboxylic acid, as generally encountered with unsolvated (i.e., "pure") carboxylic acid liquid (particularly in the case of formic acid liquid), is circumvented. As polymerization of the carboxylic acid is highly detrimental to the process by causing an uncontrollable and progressive drop in vaporization of the carboxylic acid during use, the significance of circumventing this problem by the foregoing embodiment can be readily appreciated. Furthermore, there is a particular advantage in the use of lower boiling solvents (i.e., lower boiling point than the boiling point of the carboxylic acid) because a solution of a carboxylic acid with such a solvent permits vaporization at a lower temperature than the temperature required for vaporization of the pure carboxylic acid. The use of a lower temperature for vaporization minimizes all forms of heat-induced degradation. Furthermore, use of an anhydrous solution of the carboxylic acid permits a more constant vaporization rate by use of a constant temperature on the solution, since the vaporization rate is not being affected by polymerization reactions as in the case of the pure carboxylic acid. Generation of a constant vaporization rate further permits a more accurate reading of the amount of carboxylic acid contained in the vapor. An accurate reading of the amount of carboxylic acid contained in the vapor is beneficial for providing a more consistent, repeatable, and optimized oxide removal process.

The hydrocarbon or ether solvent can be straight-chained or branched, saturated or unsaturated, cyclic or acyclic, and aliphatic or aromatic. Preferably, the hydrocarbon or ether solvent contains precisely, or at least, or no more than two, three, four, five, six, seven, eight, nine, ten, eleven, or twelve carbon atoms, or a number of carbon atoms within a range bounded by any two of the foregoing carbon atom numbers.

The solvent or solvent system is preferably liquid at room temperature (a temperature within about 15-30° C.) or at the temperature the solution is being used in the copper oxide removal process (e.g., cooling could be used to liquify a low boiling point solvent). The solvent or solvent system preferably has a boiling point of at least −20° C., −15° C., −10° C., 0° C., 5° C., 10° C., 15° C., 20° C., 25° C., 30° C., 35° C., 40° C., 45° C., 50° C., 55° C., 60° C., 65° C., 70° C., 75° C., or 80° C. The solvent or solvent system preferably has a boiling point no more than, or less than, 200° C., or, in different embodiments, no more than, or less than, 190° C., 180° C., 170° C., 160° C., 150° C., 140° C., 130° C., 120° C., 110° C., 100° C., 90° C., 80° C., 70° C., 60° C., or 50° C., or alternatively, within a range bounded by any two of the foregoing values.

In one embodiment, the solvent is composed of one or more hydrocarbon solvents. The hydrocarbon solvent is, in a first embodiment, composed of molecules containing solely carbon and hydrogen atoms. Some examples of such hydrocarbon solvents include n-butane, isobutane, n-pentane, isopentane, neopentane, n-hexane, n-heptane, n-octane, isooctane, nonane, decane, undecane, cyclopentane, cyclohexane, 1-butene, 2-butene, 1,3-butadiene, cyclopentene, cyclohexene, cyclohexadiene, benzene, toluene, xylenes (o-, m-, and p-), and decalin. The hydrocarbon is, in a second embodiment, a fluorinated hydrocarbon, such as a fluorohydrocarbon or fluorocarbon. Some examples of suitable fluorinated hydrocarbons include fluoropentane, 1,1,1-trifluoropentane, fluorohexane, perfluorohexane, perfluoroheptane, perfluorooctane, fluorobenzene, 1,2-difluorobenzene, 1,3-difluorobenzene, 1,4-difluorobenzene, and hexafluorobenzene, or a mixture thereof. The hydrocarbon is, in a third embodiment, a chlorinated hydrocarbon, such as a chlorohydrocarbon or chlorocarbon. Some examples of suitable chlorinated hydrocarbons include methylene chloride, chloroform, vinylchloride, 1,1-dichloroethylene, n-propylchloride, isopropylchloride, n-butylchloride, isobutylchloride, tetrachloroethylene, chloropentane, 1,5-dichloropentane, 1,1,1-trichloropentane, chlorohexane, 1,6-dichlorohexane, chloroheptane, 1,7-dichloroheptane, chlorobenzene, 1,2-dichlorobenzene, 1,3-dichlorobenzene, 1,4-dichlorobenzene, and 1,3,5-trichlorobenzene, or a mixture thereof.

In another embodiment, the solvent is composed of one or more ether solvents. The ether solvent considered herein typically contains one, two, or three oxygen atoms, each engaged in a C—O—C bonding scheme. The ether solvent is preferably composed of molecules containing solely carbon, hydrogen, and oxygen atoms. However, the ether solvent may contain one or more halogen atoms (e.g., fluorine or chlorine atoms) substituting a respective number of hydrogen atoms.

Some examples of suitable ether solvents include diethyl ether, furan, tetrahydrofuran, tetrahydropyran, methoxyethane, diisopropyl ether, diisobutyl ether, di-t-butyl ether, methyl-t-butyl ether, ethyl-t-butyl ether, diphenyl ether, methoxycyclohexane, anisole, dimethoxymethane, dimethoxyethane (glyme), ethylene glycol dimethyl ether, ethylene glycol diethyl ether, ethylene glycol dibutyl ether, and diethylene glycol dimethyl ether. The ether solvent can also be combined with one or more hydrocarbon solvents.

In different embodiments, the total concentration of carboxylic acids in the solution is about, at least, or up to, for example, 1%, 2%, 5%, 10%, 15%, 20%, 25%, 30%, 35%, 40%, 45%, 50%, 55%, 60%, 65%, 70%, 75%, 80%, 85%, 90%, or 95% by weight (wt %) of the solution. Alternatively, the total concentration of carboxylic acids in the solution can be within a range bounded by any two of the foregoing exemplary values (e.g., 1-90%, 1-70%, 1-50%, 1-30%, 5-90%, 5-70%, 5-50%, 5-30%, 10-90%, 10-70%, 10-50%, or 10-30%).

The carboxylic acid concentration in the resulting vapor can be within the scope of concentrations delineated above for the solution. However, depending on the methodology employed to generate a vapor of the solution, the carboxylic acid concentration in the vapor can be either substantially the same or substantially different than its concentration in the solution. For example, if the vapor is generated solely by heating the solution (e.g., to the boiling point), the vapor generally possesses a carboxylic acid concentration substantially the same as in the solution. However, if a bubbling process is used to cause or promote the vaporization process, then the vapor is necessarily diluted by the bubbling gas. Furthermore, the solution may or may not be bubbled while the produced vapor itself is diluted by one or more diluent flow gases. Typically, the diluent flow gas is a dry inert gas, such as nitrogen or argon.

Generally, it is preferred that the copper oxide removal process be conducted in the substantial or complete absence of oxygen and water vapor. Oxygen can be excluded from the process by any of the processes and safeguards known in the art for such a purpose, such as, for example, solvent distillation and oxygen-capture methodologies commonly employed in the art coupled with periodic or continuous purging with one or more inert gases. Water vapor can be excluded from the system by the above manner, and also, by use of molecular sieves (i.e., desiccants) in the solvent system and/or treatment of vapor streams with a porous desiccant.

In a particular aspect, the above copper oxide removal process is directed to copper oxide removal for a semiconductor substrate containing copper features or components thereon. The semiconductor can have any of the basic or complex circuit device elements commonly contained in semiconductor devices, such as processors, transistors, diodes, integrated circuits, and one or more dielectric layers. Typically, the copper oxide layer in a semiconductor substrate is located on copper interconnects and/or copper bonding pads contained thereon.

FIG. 1A depicts an exemplary semiconductor interconnect substrate 50 that contains a copper oxide layer 1 covering copper interconnect structures 3. Such a substrate can be fabricated using interconnect techniques well known to those skilled in the art. The semiconductor substrate also typically includes an ILD component 2 (i.e., "interlevel dielectric material" or "intermetal dielectric layer") and a barrier metal film or resistor component 4. The ILD component can have, for example, a nitride (e.g., silicon nitride), oxynitride (e.g., silicon oxynitride), or oxide (e.g., silicon oxide) composition. Some examples of ILD materials include $SiO_2$, a doped or undoped silicate glass, carbon-doped oxides (i.e., organosilicates) that include atoms of Si, C, O, and H, silsesquioxanes, thermosetting polyarylene ethers, silicon nitride, silicon oxynitride, or any combination thereof, including multilayers thereof. The term "polyarylene" is used herein to denote unsubstituted or heteroatom-substituted aromatic rings that are linked together by carbon-carbon bonds, or as fused rings, or by linking groups, such as, for example, oxygen, sulfur, sulfone, sulfoxide, amino, imino, amido, carbonyl, or carbonate groups. The ILD can be porous and/or non-porous. The barrier metal film can have, for example, a Ta-type or W-type composition useful for this purpose (e.g., TaN/Ta/Cu).

Figure 1B:
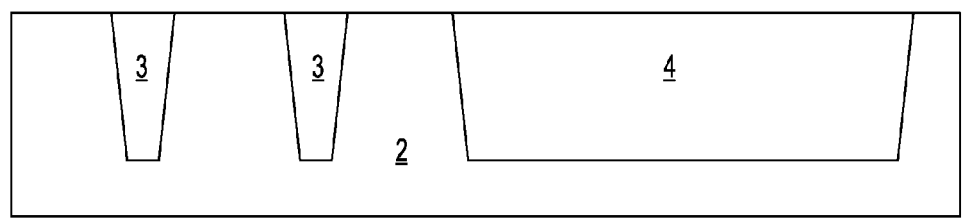
Figure 1C:
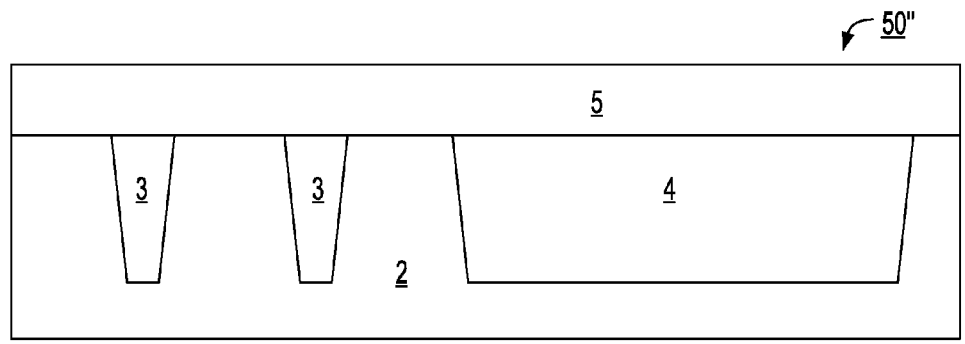

As shown in FIG. 1A, the method first involves contacting the semiconductor interconnect substrate 50 with a vapor of the carboxylic acid under suitable conditions to remove the copper oxide to produce a substrate 50' with a clean copper surface as shown in FIG. 1B. The removal of the copper oxide layer 1 is conducted under conditions wherein oxygen gas and water vapor are substantially absent. As shown in FIG. 1C, while maintaining a substantial absence of oxygen gas and water vapor (i.e., in the absence of an air break), a protective film 5 is then deposited on the cleaned surface of the semiconductor substrate 50', as illustrated in FIG. 1B, to produce a coated semiconductor substrate 50".

In a preferred embodiment, plasma processing of the semiconductor device is excluded from the process. In another preferred embodiment, a strong acid, such as hydrochloric acid, hydrofluoric acid, nitric acid, or sulfur acid, is excluded from the process.

Figure 2:
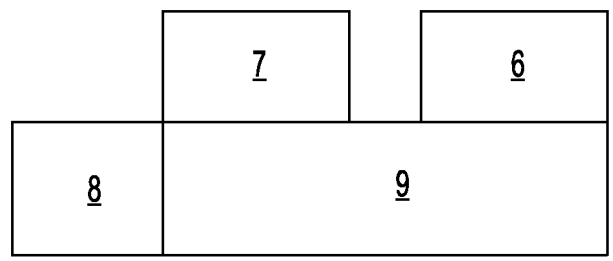
FIG. 2 is a diagram depicting an exemplary semiconductor processing apparatus of the invention.

FIG. 2 is a drawing depicting some of the basic features of a preferred processing arrangement for achieving the semiconductor processing described above in FIGS. 1A-1C in the absence of an air break. The entire processing apparatus depicted in FIG. 2 is airtight. In FIG. 2, a processing chamber 6 is provided for treating the semiconductor by the copper oxide removal process described above. Before treating the semiconductor device by the copper oxide removal process, the processing chamber 6 is evacuated (typically, by vacuum transfer chamber 9 to a pressure of, for example, 20, 10, 5, or 1 millitorrs) and purged with an inert gas a suitable number of times to ensure complete removal of oxygen and water. Once the copper oxide removal process is complete, the semiconductor device is transferred to a film deposition chamber 8 by use of vacuum transfer chamber 9, which is connected with the processing chamber 6 and the film deposition chamber 8. By maintaining the transfer chamber under inert and dry atmosphere conditions, the transfer process is conducted under conditions that prevent air or moisture contact with the semiconductor device. Before the semiconductor device enters the film deposition chamber 8, the film deposition chamber 8 is ensured to be completely bereft of oxygen and water. In film deposition chamber 8, a protective film (such as NBLoK™ or "SiCN") is then deposited on the semiconductor device by methods commonly known in the art. One or more optional chambers 7, also maintained under a dry inert atmosphere, can also be included for performing one or more steps before the copper oxide removal step, or after the copper oxide removal step and before the film deposition process, or after the deposition process.

Figure 3:
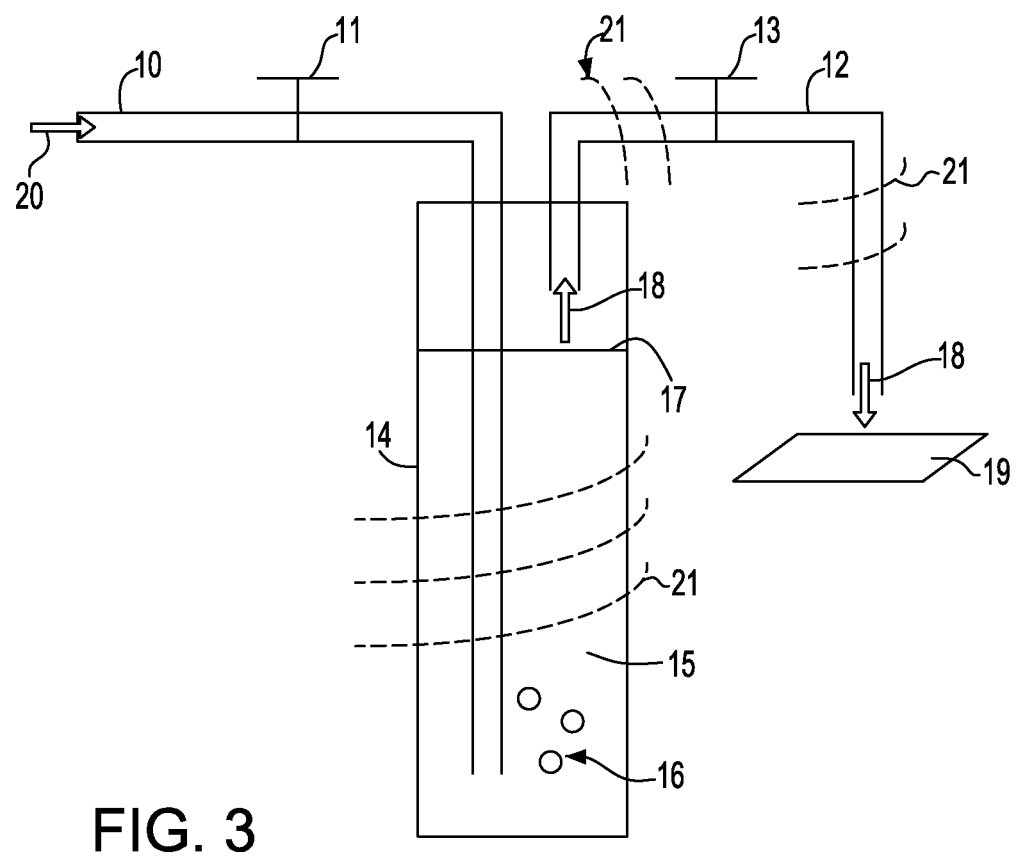
FIG. 3 is a diagram depicting an exemplary vapor generation and semiconductor exposure process of the invention.

FIG. 3 is a drawing depicting some of the features of a preferred manner for practicing the copper oxide removal process. As shown in FIG. 3, a container 14 contains an anhydrous source of a carboxylic acid 15, or more preferably, a solution of a carboxylic acid 15. A solution of carboxylic acid is as described above. An optional heating or cooling device 21 (e.g., heating or cooling tape, tubing, oven, heating gasket, or a jacket) can be used to heat or cool the solution or resulting vapor to a desired temperature. When a heating device is used for the solution, the solution is preferably heated to keep the solution at a constant temperature that will cause a desired vaporization rate. The heating or cooling device can be used to adjust the temperature of the pure carboxylic acid or carboxylic acid solution to any suitable or desired temperature, such as a temperature of at least, or no more than, or about −10° C., 0° C., 5° C., 10° C., 20° C., 30° C., 40° C., 50° C., 60° C., 70° C., 80° C., 90° C., 100° C., 110° C., 120° C., 130° C., 140° C., or 150° C., or a temperature within a range bounded by any two of the foregoing exemplary temperatures. In other embodiments, the pure carboxylic acid or carboxylic acid solution is maintained at the boiling temperature of the solution, or below the boiling temperature of the solution by a certain amount, e.g., by about, or at least, or no more than 10° C., 20° C., 30° C., 40° C., or 50° C. below the boiling point of the solution.

Preferably, to help generate a vapor of the carboxylic acid, a bubbler is employed to generate bubbles 16 in the solution. The bubbler preferably includes a conduit 10 (e.g., tube, hose, or pipe) through which an inert gas 20 is made to flow. Alternatively, a bubbler is used without heating or cooling of the solution. As shown in FIG. 3, the outflow end of conduit 10 should be below the surface level 17 of the solution 15 in order to generate bubbles 16 therein. A gas flow regulator 11 (e.g., a valve) can be included to regulate the flow of inert gas 20. The generated carboxylic acid-containing vapor 18 then rises above the solution surface 17 and enters into the inlet end of a conduit 12, whose inlet end is above the solution surface 17.

If desired, the conduit 12 can also be fitted with a heating or cooling device 21 independent of whether a heating or cooling device is used on solution 15. The conduit 12 (and thus, resulting flowing vapor) are preferably adjusted in temperature to any of the exemplary temperatures given above for the pure carboxylic acid or solution thereof. In a preferred embodiment, in order to prevent condensation from occurring in conduit 12, conduit 12 is maintained at a temperature higher than the temperature of the solution 15. The conduit 12 may preferably be kept at a temperature that is, for example, about, or at least, or no more than 10° C., 20° C., 30° C., 40° C., or 50° C. about the temperature of the solution 15.

Conduit 12 can also optionally include a vapor flow regulator 13 to adjust the flow rate of vapor 18. The outlet end of conduit 12 releases vapor 18 onto a semiconductor 19. Preferably, a tipped nozzle is employed at the outlet end of the conduit 12 in order to more precisely position the outflow of vapor on the copper components of the semiconductor device.

The semiconductor device is preferably positioned on a heatable surface. Preferably, a thermocouple device is positioned close to the semiconductor surface in contact with the vapor in order to monitor the processing temperature. During processing, the semiconductor device is typically grounded by use of an electrostatic chuck. The process described above may, if desired, be performed simultaneously with one or more other processes that could benefit from copper oxide removal, e.g., a wirebonding process.

Other components can be included, if desired, in the processing arrangement depicted in FIG. 3. For example, one or more temperature sensors and/or indicators can be included to monitor the temperature of the solution 15 and/or vapor 18. Gas flow rate sensors may also be included. A solution level sensor may also be included for sensing the amount of solution left in the container 14, as well as means for indicating when additional solution is required, or automatic means for replenishing and/or replacing the solution when the solution level goes below a specified level or when the solution becomes spent. Computer and electronic processing equipment can also be included for running or maintaining the process based on input commands or programming.

While there have been shown and described what are presently believed to be the preferred embodiments of the present invention, those skilled in the art will realize that other and further embodiments can be made without departing from the spirit and scope of the invention described in this application, and this application includes all such modifications that are within the intended scope of the claims set forth herein.

What is claimed is:

1. A method for removing copper oxide from a copper surface to provide a clean copper surface, the method comprising exposing said copper surface containing copper oxide thereon to an anhydrous vapor containing a carboxylic acid compound therein, wherein the anhydrous vapor is generated from an anhydrous organic solution comprised of the carboxylic acid and one or more solvents selected from hydrocarbon and ether solvents.

2. The method of claim 1, wherein the one or more solvents have boiling points of no more than 150° C.

3. The method of claim 1, wherein the one or more solvents are one or more hydrocarbon solvents.

4. The method of claim 3, wherein the one or more hydrocarbon solvents are saturated hydrocarbon solvents.

5. The method of claim 1, wherein the carboxylic acid is selected from formic, acetic, and propionic acids.

6. The method of claim 1, wherein the anhydrous organic solution contains the carboxylic acid compound in a concentration up to 90% by weight of the anhydrous organic solution.

7. The method of claim 1, wherein the anhydrous organic solution contains the carboxylic acid compound in a concentration from 5 to 90% by weight of the anhydrous organic solution.

8. The method of claim 1, wherein the anhydrous organic solution contains the carboxylic acid compound in a concentration up to 50% by weight of the anhydrous organic solution.

9. The method of claim 1, wherein the anhydrous organic solution contains the carboxylic acid compound in a concentration from 5 to 50% by weight of the anhydrous organic solution.

10. The method of claim 1, wherein the copper surface is treated with the anhydrous vapor at a processing temperature of 80-400° C.

11. The method of claim 1, wherein the copper surface is treated with the anhydrous vapor at a processing temperature up to 225° C.

12. The method of claim 1, wherein said copper surface includes a copper surface of one or more copper interconnects, wherein said copper interconnects are contained on a semiconductor substrate.

13. The method of claim 1, wherein said method is conducted prior to a step of depositing a protective film on the resulting clean copper surface, wherein the copper oxide removal process through the protective film deposition process is conducted in the substantial absence of oxygen and water vapor.

14. A method for processing a semiconductor substrate containing copper interconnects thereon in which the copper interconnects contain a layer of copper oxide, the method comprising:

removing the layer of copper oxide by exposing said copper surface containing copper oxide thereon to an anhydrous vapor containing a carboxylic acid compound such that a clean copper surface absent a copper oxide layer is provided on said copper interconnects; and depositing a protective film on at least the cleaned copper interconnects;

wherein the copper oxide removal process through the deposition of the protective film is conducted in the substantial absence of oxygen and water vapor, and wherein said anhydrous vapor is generated from an anhydrous organic solution comprised of the carboxylic acid compound and one or more solvents selected from hydrocarbon and ether solvents.

15. The method of claim 14, further comprising, prior to said step of removing the layer of copper oxide, a chemical-mechanical polishing step on said semiconductor substrate.

16. The method of claim 14, wherein the one or more solvents have boiling points of no more than 150° C.

17. The method of claim 14, wherein the one or more solvents are one or more hydrocarbon solvents.

18. The method of claim 14, wherein the anhydrous organic solution of formic acid contains formic acid in a concentration from 5 to 90% by weight of the anhydrous organic solution.

19. The method of claim 14, wherein the anhydrous organic solution of formic acid contains formic acid in a concentration from 5 to 50% by weight of the anhydrous organic solution.

* * * * *